US006195438B1

(12) United States Patent
Yumoto et al.

(10) Patent No.: US 6,195,438 B1
(45) Date of Patent: *Feb. 27, 2001

(54) METHOD AND APPARATUS FOR LEVELING AND EQUALIZING THE AUDIO OUTPUT OF AN AUDIO OR AUDIO-VISUAL SYSTEM

(75) Inventors: Hideki Yumoto, Chula Vista, CA (US); Theodore S. Rzeszewski, Wheaton, IL (US)

(73) Assignee: Matsushita Electric Corporation of America, Secaucus, NJ (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/925,318

(22) Filed: Sep. 8, 1997

Related U.S. Application Data

(63) Continuation-in-part of application No. 08/370,397, filed on Jan. 9, 1995, now Pat. No. 5,666,430.

(51) Int. Cl.[7] ........................................................ H03G 5/00
(52) U.S. Cl. ............................ 381/103; 381/102; 381/107
(58) Field of Search ............................... 381/98, 100–103, 381/104, 106–107, 109

(56) References Cited

U.S. PATENT DOCUMENTS

| | | | |
|---|---|---|---|
| 4,045,748 | 8/1977 | Filliman | 330/126 |
| 4,602,337 * | 7/1986 | Cox | 381/98 |
| 4,903,307 * | 2/1990 | Ozawa et al. | 381/103 |
| 5,172,358 * | 12/1992 | Kimura | 381/102 |
| 5,434,867 | 7/1995 | Beijer | 330/107 |
| 5,450,312 * | 9/1995 | Lee et al. | 364/130 |
| 5,506,910 | 4/1996 | Miller et al. | 381/103 |
| 5,572,443 | 11/1996 | Emoto et al. | 364/550 |
| 5,579,404 * | 11/1996 | Fielder et al. | 381/101 |
| 5,617,478 * | 4/1997 | Tagami et al. | 381/103 |
| 5,666,430 * | 9/1997 | Rzeszewski | 381/107 |
| 5,706,357 * | 1/1998 | Yang | 381/107 |
| 5,712,953 * | 1/1998 | Langs | 704/214 |
| 5,727,074 * | 3/1998 | Hildebrand | 381/103 |
| 5,745,583 * | 4/1998 | Koizumi et al. | 381/103 |
| 5,771,464 * | 6/1998 | Umemoto et al. | 381/107 |
| 5,802,187 * | 9/1998 | Hsu | 381/104 |

* cited by examiner

Primary Examiner—Duc Nguyen
(74) Attorney, Agent, or Firm—McDermott, Will & Emery

(57) ABSTRACT

A microcomputer for automatically controlling the sound in an audio or audio-visual system. Incoming audio signals from multiple channels are combined and fed to a pair of detector-rectifier circuits. One detector-rectifier circuit is a smoothing circuit with a time constant longer than that of the other detector-rectifier circuit. The signals with a longer time constant are fed to the microprocessor to control the volume function of an audio or audio-visual system. The signals with a shorter time constant are fed to the microprocessor to equalize the source frequency spectrum of an audio or audio-visual system.

31 Claims, 14 Drawing Sheets

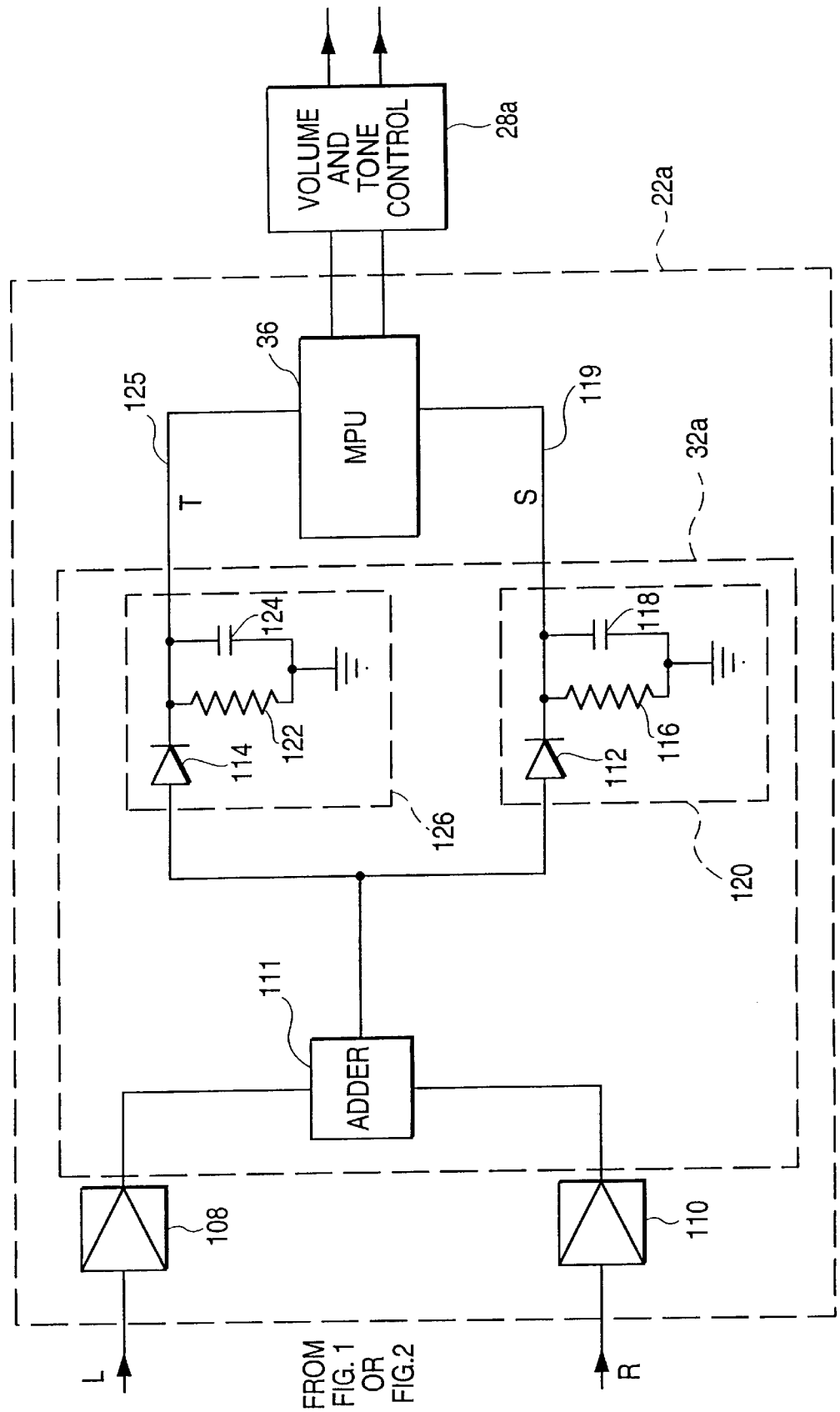

METHOD AND APPARATUS FOR LEVELING AND EQUALIZING THE AUDIO OUTPUT OF AN AUDIO OR AUDIO-VISUAL SYSTEM

CROSS-REFERENCE TO RELATED APPLICATION

This is a continuation-in-part application of prior application Ser. No.: 08/370,397 filed Jan. 1, 1995, now Patent No.: 5,666,430, which issued Sep. 9, 1997.

BACKGROUND OF THE INVENTION

This invention relates in general to the audio output of a receiver. More particularly, the invention relates to an apparatus and method for maintaining a substantially level audio output and controlling the tone of the audio output in an audio or audio-visual system.

Examples of audio and/or visual systems include: radios, televisions, tape players, digital tape players, compact disc (CD) players, and digital video disc (DVD) players. Examples of televisions include: analog NTSC television receivers, digital TV receivers or advanced television receivers, and the like. The present invention may also be incorporated in audio encoding or decoder devices.

The loudness of the audio output from a television receiver often changes from program to commercial on a given channel, from program to program on a given channel, and from channel to channel. Additionally, many television programs and most motion pictures intentionally vary the loudness from scene to scene to simulate how the sounds would be experienced in real life. For example, the sound of a gun shot or a cheering crowd at a football game is louder than the sound of two people having a face-to-face conversation in a room.

However, such real life loudness variations, while having some value in a movie theater, are often a source of annoyance when viewing a television program at a relatively close range in a relatively confined area. In an effort to correct this annoyance, some television manufacturers have incorporated automatic volume leveling (AVL) circuitry in their televisions. Such AVL circuits are similar to analog leveling circuitry found in various audio products such as tape recorders. While these analog AVL circuits provide some relief from loudness variations, they generally suffer from having a limited volume hold time for quiet passages, and slow attach and decay (release) times constants. In addition, the AVL circuitry raises the cost of the television.

In addition, the level of loudness perceived by humans varies considerably depending on the frequency and amplitude of the sound. When comparing music in a concert hall with music in a home environment, the music will not sound the same to the listener, even though the frequency spectrum is exactly the same but at a different sound or amplitude level. In particular, the ear is less sensitive to low and high frequencies at low sound levels. This justifies increasing the bass-treble settings for musical sources in the home setting.

Certain conventional systems may have sound equalizers built in for adjusting the bass-treble controls of the system. For listening to the musical contents with conventional systems, the bass-treble settings may be increased to make the music contents sound more realistic. However, for vocal contents, a decrease in the bass and treble settings results in a better signal to noise ratio. An automatic equalizer device alters the source frequency spectrum by automatically adjusting the bass-treble settings depending on the program source.

Accordingly, it would be advantageous to provide an automatic audio leveling and source frequency spectrum equalizing apparatus and method that would provide an infinite hold time for quiet passages, fast and precise attack and decay times, and frequency spectrum adjustments, which would not require additional circuitry.

BRIEF SUMMARY OF THE INVENTION

Thus, it is an object of the present invention to provide a low cost method and apparatus for maintaining a substantially constant audio output and for automatically adjusting the tone of the sound from a receiver.

It is another object of the present invention to provide a method and apparatus capable of relatively fast and precise response times in maintaining a substantially constant audio output and the desired tone from a receiver.

It is yet another object of the present invention to provide a method and apparatus capable of maintaining a substantially constant audio output from a receiver during quiet passages.

It is still another object of the present invention to provide a precise, efficient, reliable, and easily implemented method and apparatus for maintaining a substantially constant audio output from a receiver.

These and other objects are realized in accordance with the present invention by providing a microcomputer for automatically controlling an audio output from a receiver. The microcomputer calculates a power signal corresponding to the power of a detected audio input signal, determines whether the calculated power signal is above or below a predetermined power value, generates a power control signal in response to whether the calculated power signal is above or below the predetermined value, and uses the power control signal to automatically control the receiver's audio output and maintain a substantially constant audio output.

In another embodiment, the method and apparatus of the present invention is implemented as a detection circuit in communication with a microcomputer. The detection circuit calculates a power signal corresponding to the power of a detached audio input signal. The microcomputer determines whether the calculated power signal is above or below a predetermined power value, generates a power control signal in response to whether the calculated power signal is above or below the predetermined value, and uses the power control signal to automatically maintain a substantially constant audio output from the receiver.

Accordingly, the present invention achieves several advantages. In particular, when the receiver is a television, the method and apparatus of the present invention saves manufacturing costs and complexity by incorporating its audio leveling operations into the microcomputer that is already present in most current televisions. The speed and precision of the computer-implemented present invention is superior to prior art analog audio leveling circuits, thereby decreasing response times, allowing quiet passages to be maintained indefinitely, and allowing the necessary audio adjustments to be made in real time.

It is a further object of the present invention to combine the audio leveling function with an automatic audio spectrum equalizing function into a single integrated microprocessor controlled system.

The present invention also uses the microcomputer to control the tone and volume of an audio or audio-visual system, which microcomputer is interfaced with optional pre-processing circuitry. In particular, a microcomputer may function to control the bass-treble settings and volume of audio signals in such a system controlled by a volume and tone control. As a variation, the present invention may use the microcomputer to control the tone and volume of an audio or audio-visual system without optional pre-processing circuitry, wherein the audio signals are amplified and processed by the microcomputer to control the bass-treble settings and volume of the audio signals.

Accordingly, the present invention digitally processes audio signals of an audio or audio-visual system to automatically adjust the sound output characteristics of the system, by automatically leveling the volume of audio signals; and altering a source frequency spectrum of the audio signals by automatically adjusting equalizer settings depending on the content of the source frequency spectrum, wherein a substantially constant volume and an equalized frequency spectrum is maintained in the sound of the audio or audio-visual system.

In particular, the present includes a method of digitally processing audio signals of an audio or audio-visual system to automatically adjust the sound output characteristics of the system by summing audio signals from multiple audio channels; sampling the summed audio signals at a first sampling rate for use in leveling the volume of the summed audio signals; sampling the summed audio signals at a second sampling rate for equalizing the source spectrum of the summed audio signals, wherein the second sampling rate is higher than the first sampling rate; processing the summed audio signals sampled at a first rate for leveling the volume of the summed audio signals via digital calculations; and processing the summed audio signals sampled at a second rate for equalizing the sound frequency spectrum of the summed audio signals via digital calculations.

Further, only one of the processing steps, both of the processing steps, or none of the processing steps may be carried out by making a selection to process only the summed audio signals sampled at said first rate, only the summed audio signals sampled at said second rate, both the summed audio signals sampled at said first rate and the summed audio signals sampled at said second rate, or neither the summed audio signals sampled at said first rate nor the summed audio signals sampled at said second rate.

As a variation, the summed audio signals from multiple audio channels may be sampled at a single sampling rate and used to level the volume and equalize the source frequency spectrum of the summed audio signals by summing a number of sampled audio signals over a period of time and dividing the summed sample of audio signals by the number of samples over a period, and processing the audio signals sampled over a period of time, divided by the number of samples over a period, to level the output and equalize the source frequency spectrum of the summed audio signals via digital calculations, wherein a substantially constant volume and an equalized frequency spectrum is maintained in the sound of the audio or audio-visual system.

An apparatus for digitally processing audio signals of an audio or audio-visual system for automatically adjusting the sound output characteristics of the system, comprises an automatic equalizer for altering a source frequency spectrum of audio signals by automatically adjusting equalizer settings depending on the content of the source frequency spectrum, and an audio leveler for automatically leveling the volume of audio signals, wherein said audio leveler is electrically interfaced with said automatic equalizer, and wherein a substantially constant volume and an equalized frequency spectrum is maintained in the sound of the audio or audio-visual system.

In particular, the apparatus for digitally processing audio signals of an audio or audio-visual system for automatically adjusting the sound output characteristics of the system, comprises an adder for summing audio signals from multiple audio channels, a means for sampling the summed audio signals at a first sampling rate for use in leveling the volume of the summed audio signals, a means for sampling the summed audio signals at a second sampling rate that is higher than said first sampling rate for equalizing the source frequency spectrum of the summed audio signals, and a microprocessor receiving samplings of the summed audio for processing the summed audio signals sampled at a first rate for leveling the volume of the summed audio signals via digital calculations and for processing the summed audio signals sampled at a second rate for equalizing the source frequency spectrum of the summed audio signals via digital calculations, wherein a substantially constant volume and an equalized frequency spectrum is maintained in the sound of the audio or audio-visual system.

An amplifier for each channel can be connected to the adder for amplifying the audio signal in the channel prior to being inputted to said adder.

The present invention involves hardware, i.e., physical circuits and computer software, i.e., algorithms or programs.

The invention itself, together with further objects and attendant advantages, will be understood by reference to the following detailed description, taken in conjunction with the accompanying figures.

BRIEF DESCRIPTION OF THE SEVERAL VIEWS OF THE DRAWING

FIG. 7 illustrates the details of a second embodiment showing optional pre-processing circuitry, a microprocessor, and a volume and tone control;

DETAILED DESCRIPTION OF THE INVENTION

The present invention uses a microcomputer (MPU) to automatically maintain a substantially constant audio output from a receiver. When the present invention is implemented in a television receiver, the microcomputer may be the conventional microprocessor found in most currently available television receivers. Preferably, the microprocessor would be capable of completing a variety of both simple and complex calculations in real time. However, if the chosen microprocessor is not capable of performing the required calculations, or is not capable of completing the calculations in real time, optional pre-processing circuitry may be provided for performing the required power calculations and then feeding the results to the microprocessor for further processing. Such pre-processing circuitry, however, is less complex and costly than conventional analog automatic volume leveling circuitry. Ideally, the microcomputer would be implemented as a digital signal processor, which is capable of handling the required power calculations precisely and in real time.

Figure 1:
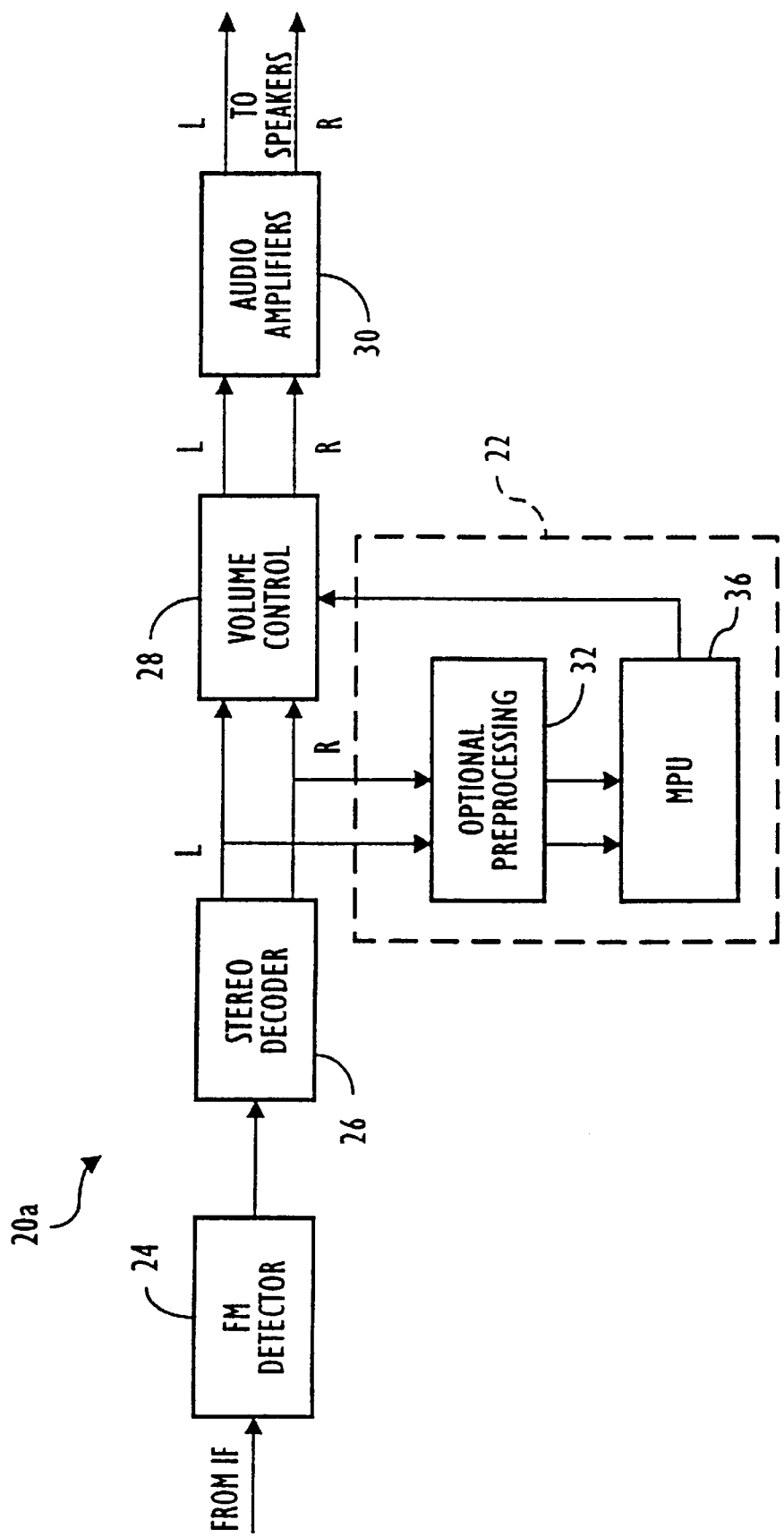
FIG. 1 is a block diagram of an audio signal path incorporating a "forward-control" audio leveling apparatus embodying the present invention.

FIG. 1 illustrates an audio signal path 20a that includes an audio leveling apparatus 22 embodying the method and apparatus of the present invention. As shown in FIG. 1, the audio leveling apparatus 22 accepts the left (L) and right (R) audio output signals from a stereo decoder 26 for automatically controlling a volume controller 28. The audio leveling apparatus 22 preferably includes at least a microcomputer 36, and may optionally include pre-processing circuitry 32.

Other than the audio leveling apparatus 22, the components of the audio signal path 20a shown in FIG. 1 are conventional. As shown in FIG. 1, a conventional FM detector 24 receives an input audio signal from an upstream IF (intermediate frequency) filter and amplifier (not shown). The FM detector 24 detects the frequency-modulated audio information and feeds it to a stereo decoder 26. The decoder 26 decodes the frequency-modulated audio information, divides it into left L and right R components or audio signals, and feeds the left L and right R signals to the volume controller 28. The volume controller 28 outputs L and R signals to audio amplifiers 30, which feed amplified L and R signals to conventional loudspeakers (not shown).

The present invention uses the microcomputer 36 to control the volume controller 28 that is interfaced with the audio leveling apparatus 22, and further with an audio or audio-visual system. The volume controller 28 is controlled by the audio leveling apparatus 22. In particular, the microcomputer 36 of the audio leveling apparatus 22 may function in a conventional manner to control the volume controller 28 and thereby, control the volume output from the speakers of an audio or audio-visual system. In accordance with the present invention, the microcomputer 36 and pre-processing circuitry 32 perform an automatic volume leveling function by accepting the left L and right R signals from the stereo decoder 26, and generating an output control signal to the volume controller 28. The control signal automatically compensates for power variations in the incoming L and R signals to the volume control 28 to maintain a substantially constant volume output from the speakers.

If the chosen microcomputer 36 is of the type that is capable of performing the required pre-processing calculations in real time, the optional pre-processing circuitry 32 may be eliminated, and left L and right R signals may be fed directly from the stereo decoder 26 to the microcomputer 36. In the block diagram depicted in FIG. 1, the left L and right R signals input to the audio leveling apparatus 22 are inputted from the upstream side of the volume controller 28. The configuration for feeding the left L and right R signals from the main portion of the audio signal path 20a to the audio leveling apparatus shown in FIG. 1 may be characterized as a "forward-control" configuration.

Figure 2:
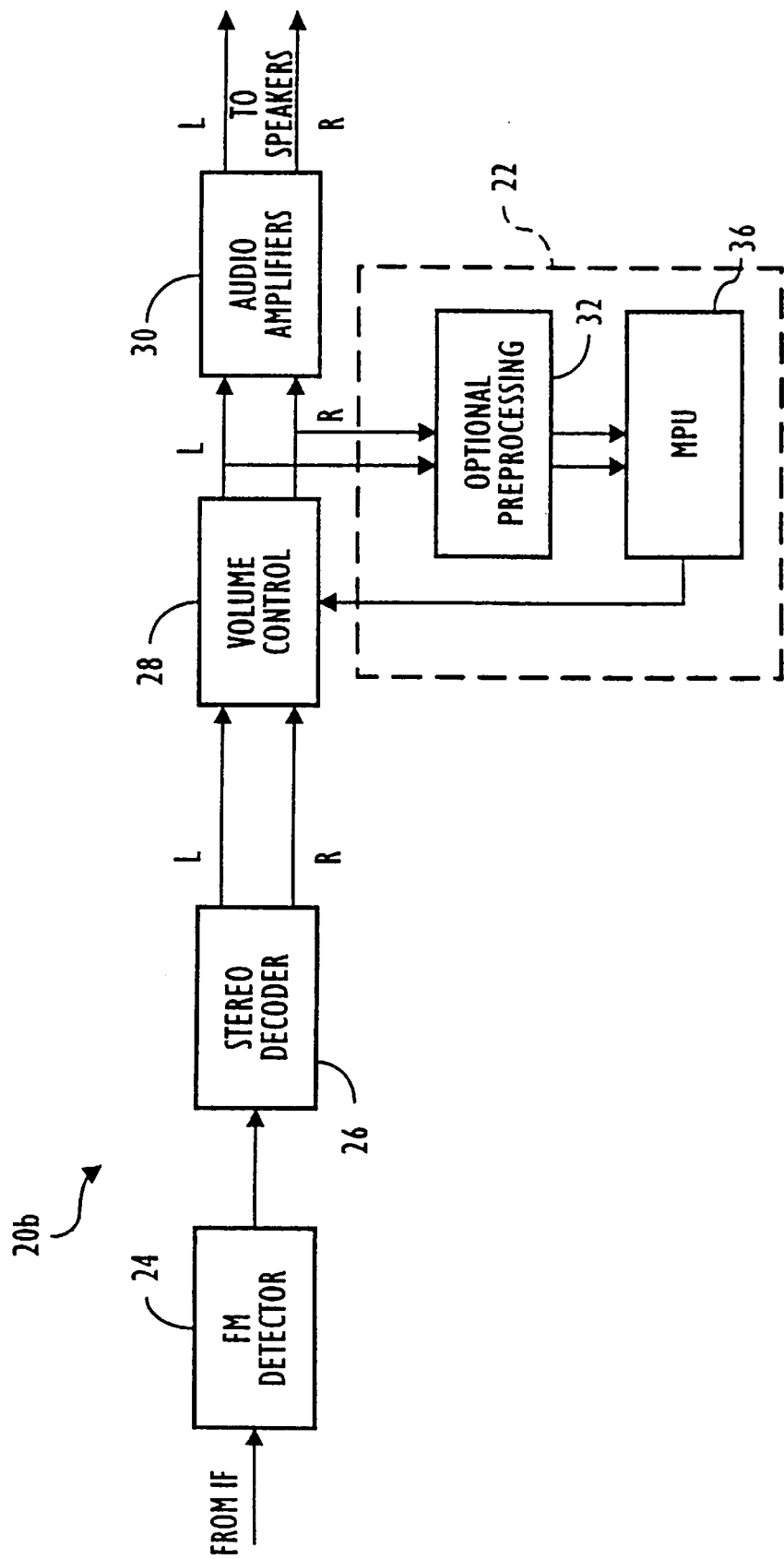
FIG. 2 is a block diagram of an audio signal path incorporating a "feedback" audio leveling apparatus embodying the present invention.

FIG. 2 is a block diagram of another audio signal path 20b incorporating the audio leveling apparatus 22. In the block diagram depicted in FIG. 2, the left L and right R signals are inputted to the audio leveling apparatus 22 from downstream side of the volume controller 28. The configuration for feeding the left L and right R signals from the main portion of the audio signal path 20b to the audio leveling apparatus 22 shown in FIG. 2 may be characterized as a "feedback" configuration. Otherwise, all of the elements shown in FIG. 2 are substantially the same as the corresponding elements shown in FIG. 1.

Figure 3:
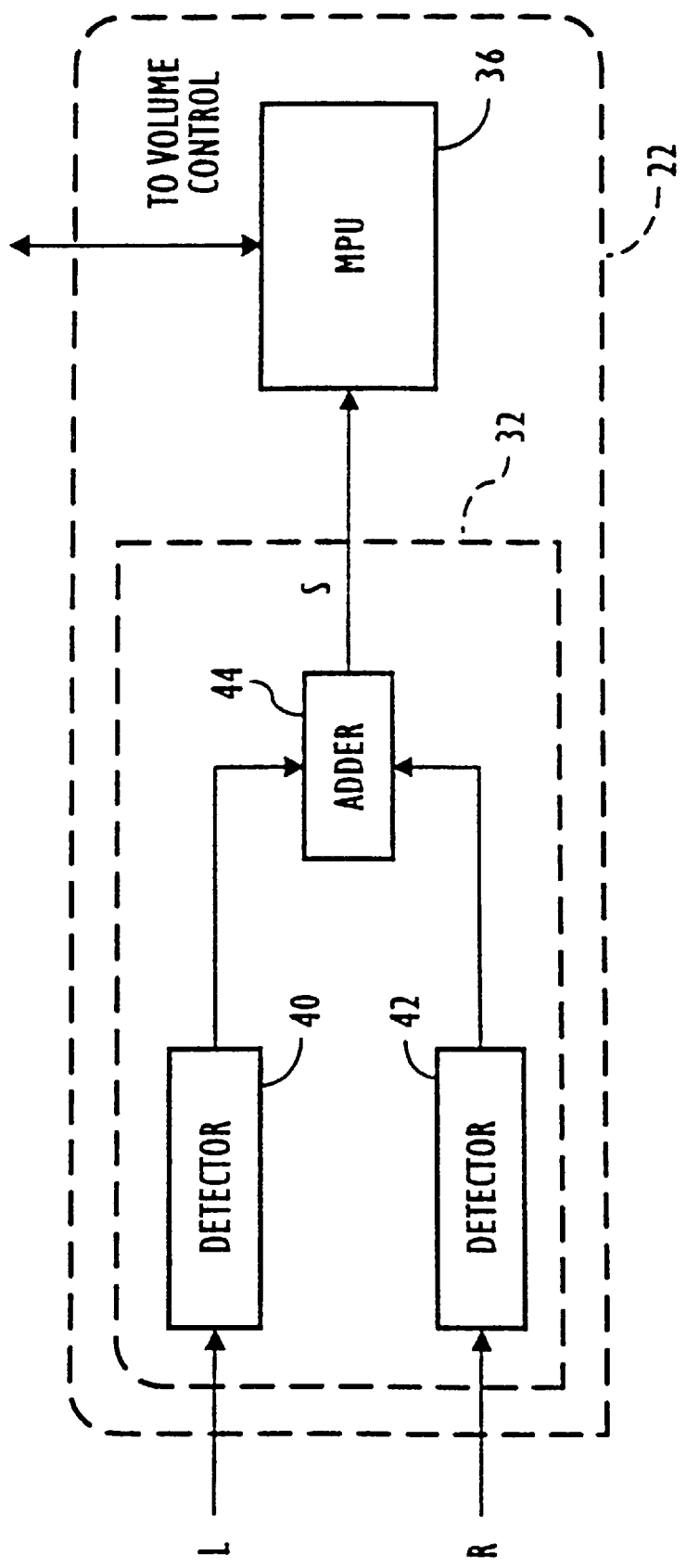
FIG. 3 is a block diagram illustrating the audio leveling apparatus shown in FIGS. 1 and 2, and more particularly illustrating details of a first embodiment of the optional pre-processing circuitry shown in FIGS. 1 and 2.

FIG. 3 illustrates a preferred embodiment of the audio leveling apparatus 22 shown in FIGS. 1 and 2. Specifically, FIG. 3 illustrates a preferred embodiment of the optional pre-processing circuitry 32. As illustrated in FIG. 3, the pre-processing circuitry 32 includes detectors 40, 42 for detecting the L and R audio signals, along with an adder circuit 44 for receiving and combining the L and R audio signals from the detectors 40, 42.

The detectors 40, 42 generate L and R power signals that correspond to the power of the L and R audio signals inputted to the detectors 40, 42. This can be accomplished in a number of ways, for example, by calculating a root-mean-square, an envelope, an average, or others. Because the power of an audio signal is directly proportional to its loudness, the L and R power signals are directly proportional to the loudness of the L and R audio signals, respectively, inputted to the detectors 40, 42. An adder 44 sums the L and R power signals into a single output power signal S. The single power signal S is then supplied to the microcomputer 36, which uses the power signal S to control the volume of the speakers (not shown).

Figure 4:
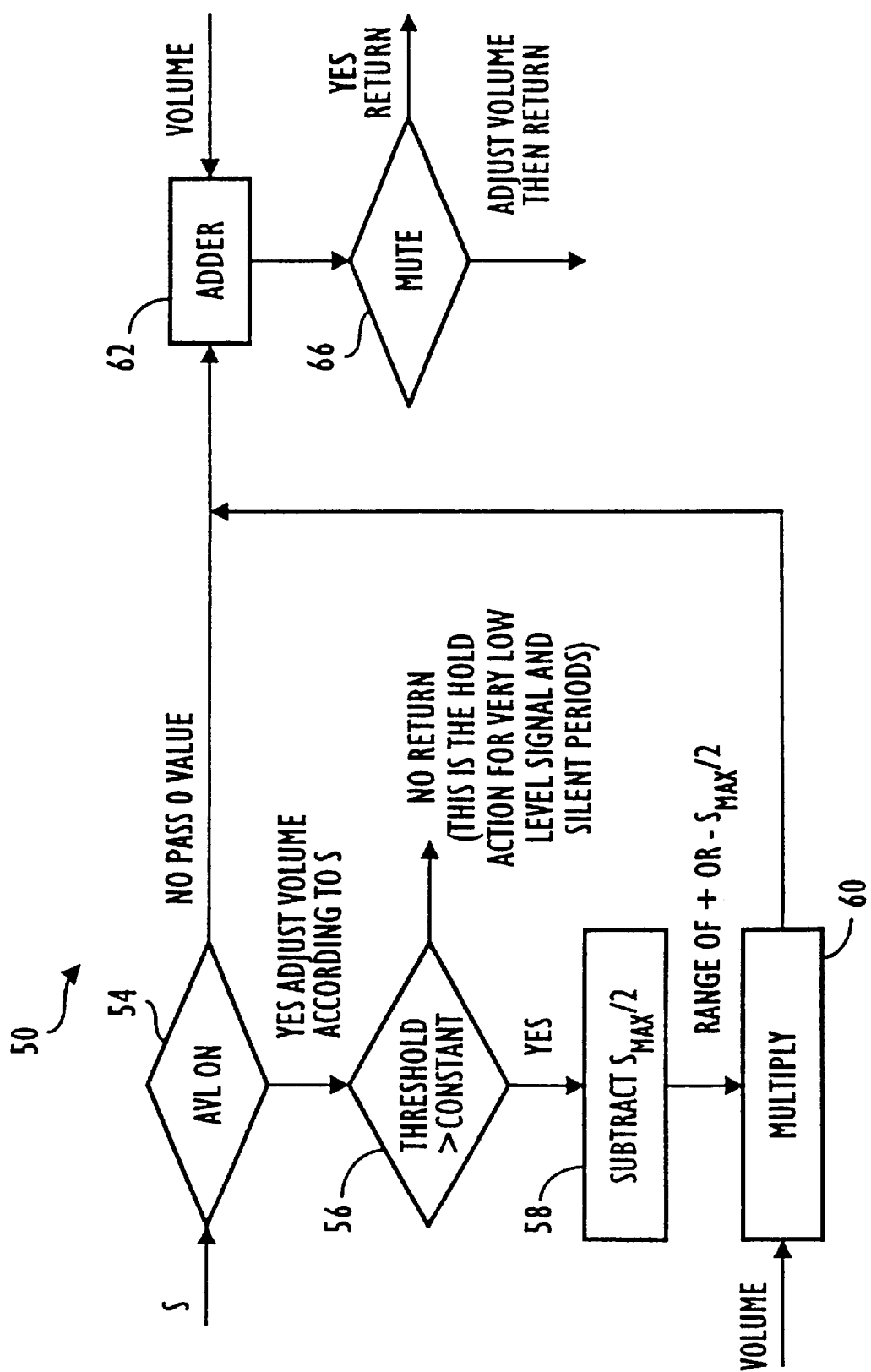
FIG. 4 is a high-level illustration of program instructions further embodying the present invention. The illustrated program may be executed by the microcomputer portion of the apparatus shown in FIGS. 1, 2 and 3.

Turning now to FIG. 4, there is illustrated a flow diagram of a leveling program 50, which is preferably executed by the microcomputer 36. At block 54, the program 50 determines whether the automatic volume leveling function has been activated by the user. If not, block 54 passes a zero value to an adder 62, which accordingly adds nothing to the volume level.

If the automatic volume level function is determined to be on at block 54, the leveling program 50 moves to block 56 where it determines whether the power signal S is greater than a predetermined threshold. If the answer to the inquiry at block 56 is no, the program 50 returns to its start, and no change is made to the volume level. It is assumed that any power level below a predetermined threshold is intended to be a quiet scene. Thus, any attempt to compensate the volume in such a situation may result in unwanted noise or other unnatural variations in the volume output.

If the power signal exceeds the threshold at block 56, the leveling program 50 moves to block 58, which determines whether the power signal S is above or below a nominal zero value for the power signal S. In the preferred embodiment, the nominal zero value is determined by setting Smax to a maximum acceptable value of S, and then dividing Smax by two (Smax/2). Smax/2 is then subtracted from the received power signal S to determine whether S is above or below the nominal value. Of course, the nominal zero value of S could be changed by dividing Smax by a number other than 2, such as 3 or 4, depending on the particular requirements of the design. The output of block 58 is a control signal falling within the range of +Smax/2 to −Smax/2.

The control signal is then supplied to a multiplying function 60 that scales the control signal by multiplying the control signal by the audio volume level set by the user. This is done to ensure that when the volume level is set high, the range of volume change (−Smax/2 to +Smax/2) is greater than when the volume level is set relatively lower. The output of the multiplying function 60 is then applied to the adder operation 62, which adds the scaled control signal to the volume level setting. The scaled control signal is either positive or negative, depending upon whether S was above or below nominal zero (Smax/2). If S was above nominal zero, the control signal is negative, and the volume is reduced. If S was below nominal zero, the control signal is positive, and the volume is increased.

The output of the adder operations 62 is then supplied to the volume controller 28 (shown in FIGS. 1 and 2) through the mute operation 66. If the mute function has been activated by the user, the volume output is suppressed by a predetermined amount. If the mute function has not been activated by the user, the leveled volume control signal passes through the mute operation 66 to the volume controller 28 (shown in FIGS. 1 and 2), and the leveling program 50 returns to its beginning to receive and analyze the next time divided power signal S.

Figure 5:
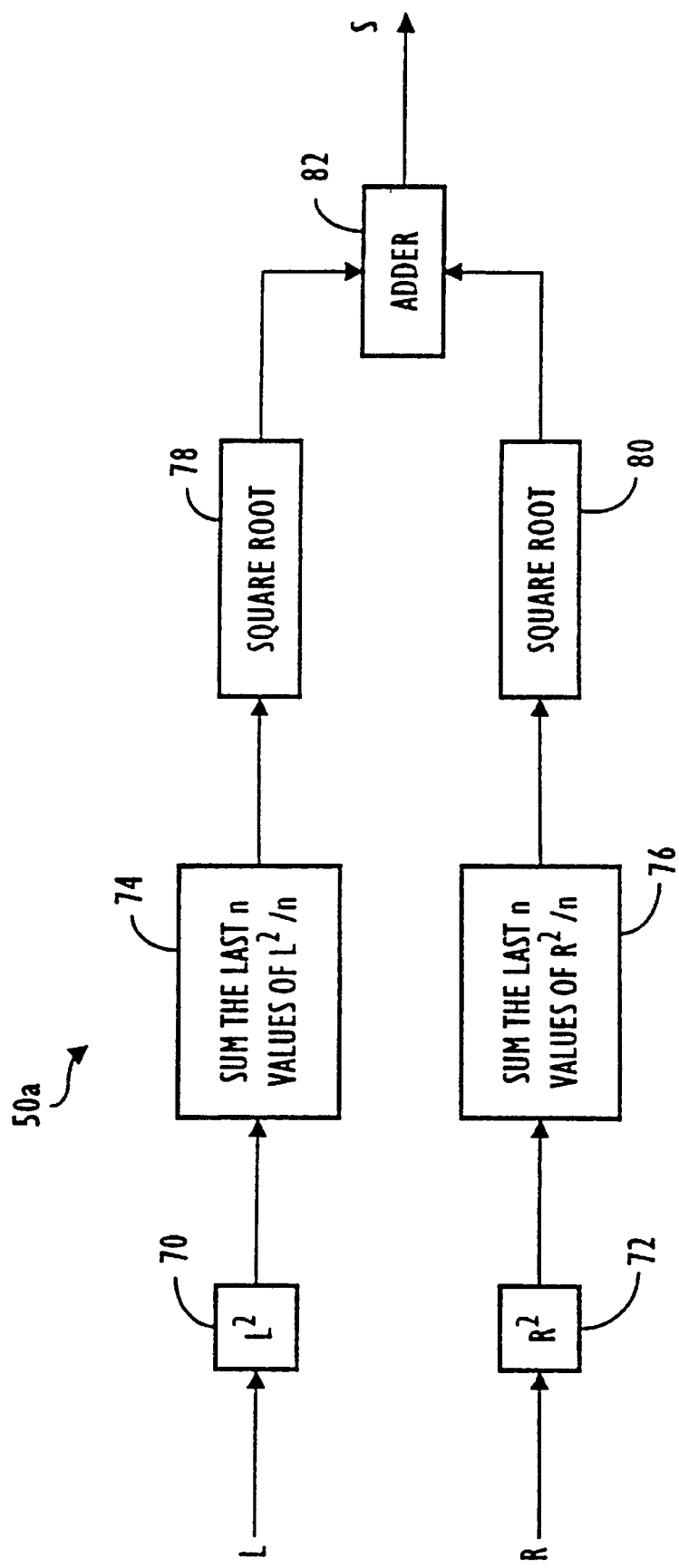
FIG. 5 is a high-level illustration of another set of program instructions embodying the present invention. The illustrated program may be executed by the microcomputer portion of the apparatus shown in FIGS. 1, 2 and 3.

Turning now to FIG. 5, there is illustrated another set of program instructions 50a, which are executed by the microcomputer 36 when the optional pre-processing circuitry 32 (shown in FIGS. 1 through 3) is not utilized. In this case, the microcomputer 36 performs the power-related calculations (which were previously described in connection with the optional pre-processing circuitry) in addition to determining the required volume adjustments (as performed by the leveling program 50 illustrated in FIG. 4).

As shown in FIG. 5, the program 50a begins by squaring the left L audio signal at block 70 and squaring the right R audio signal at block 72. The left signal L is then passed to block 74, and the right signal R is passed to block 76. Blocks 74 and 76 calculate an average value by summing the last "n" values and dividing that sum by n. Precision is increased and response time are decreased by making the proper adjustments to n. The outputs of blocks 74, 76 are then fed to blocks 78, 80, which calculate square roots of the average (time-divided) of the left L and right R values. Thus, blocks 74, 76, 78 and 80 effectively perform a root means square operation in order to determine the power levels of the left L and right R audio signals. The output of the square root blocks 78, 80 are then fed to an adder 82, which adds left L and right R signals and outputs the power signal S. This time-divided power signal S is supplied to the beginning of the leveling program routine 50 illustrated in FIG. 4.

Figure 6:
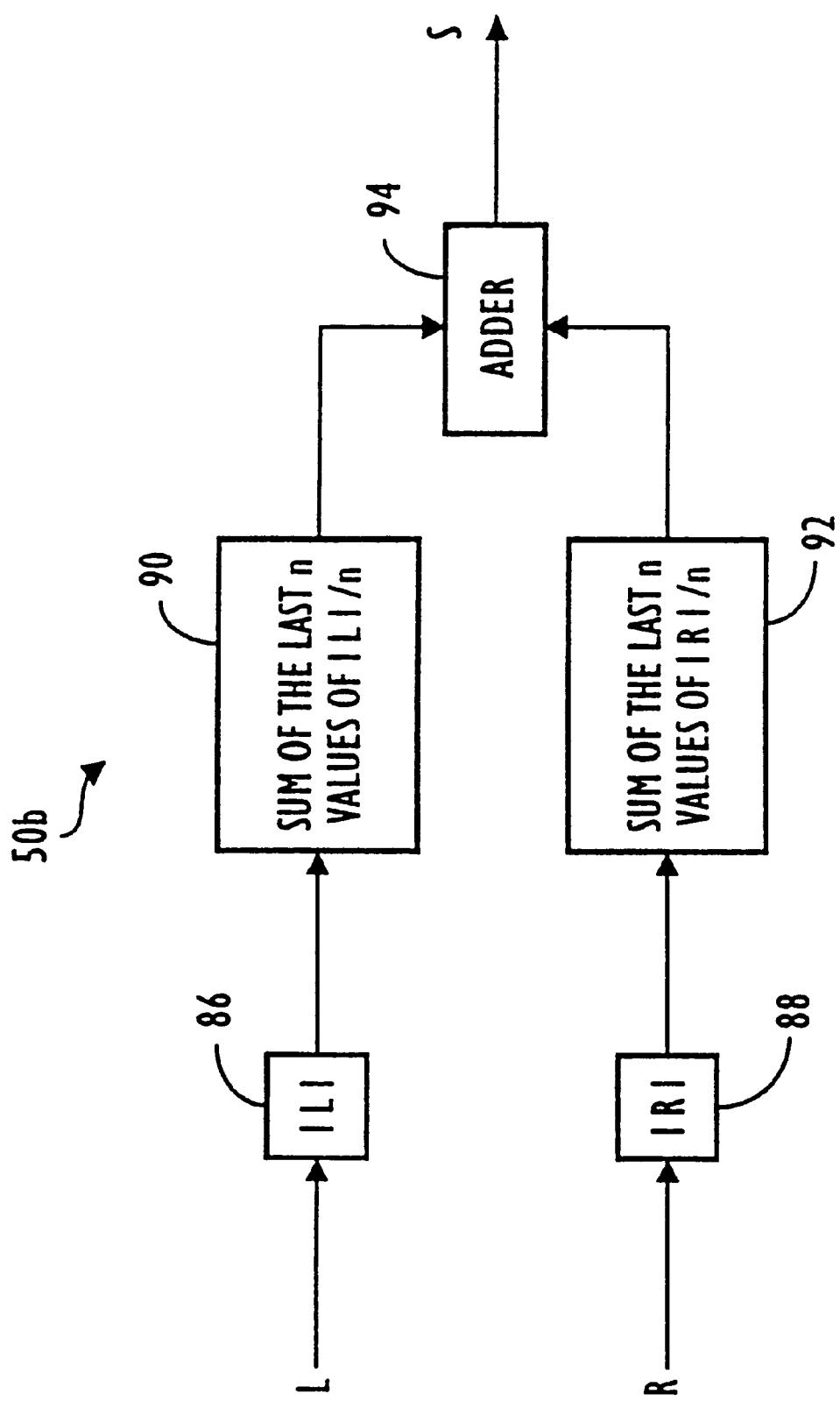
FIG. 6 is a high-level illustration of still another set of program instructions embodying the present invention. The illustrated program may be executed by the microcomputer portion of the apparatus shown in FIGS. 1, 2 and 3.

FIG. 6 illustrates yet another program 50b for determining the power level of the received audio signal. As shown in FIG. 6, the program 50b determines the absolute value of the left L and right R signals at blocks 86, 88. The outputs of blocks 86, 88 are then fed to blocks 90, 92, which determine the average of the left L and right R signals by summing the last "n" values of the left L and right R signals and dividing that sum by n. As with the program 50a shown in FIG. 5, precision is increased and response times are decreased by making the proper adjustments to n. The average left L and right R signals are then added at an adder 94, which then outputs the time-divided power signal S.

Thus, the microcomputer 36, and optionally, the pre-processing circuitry 32, develop a control signal that adds to or subtracts from the static volume output from the television receiver. In general, the control signal adds to the static volume if the received power value is lower than a predetermined value, and subtracts from the static volume if the received power signal is higher than the predetermined value. It is believed to be advantageous to set the nominal predetermined power value to correspond to 30% modulation because television broadcasts target volume levels that are nominal from the transmitter at 30% modulation. Thus, using the present invention, the zero value of signal S would be set to correspond to 30% modulation.

Accordingly, the above-described invention achieves several advantages. In particular, the method and apparatus of the present invention saves manufacturing costs and complexity by incorporating its audio leveling operations into a microcomputer of the type already found in most current televisions. The speed and precision of the computer-implemented present invention is superior to prior art analog audio leveling circuits, thereby decreasing response times and allowing the necessary audio adjustments to be made in real time.

If desired, the processing steps described herein could be altered by combining the left L and right R signals early in the signal path and processing a single signal. Also, a single signal path would be needed for monaural signals.

The level of loudness perceived by humans varies considerably depending on the frequency and amplitude of the sound. When comparing music in a concert hall with music in a home environment, the music will not sound the same to the listener, even though the frequency spectrum of the sound heard by the listener is exactly the same but at a different amplitude level. In particular, the ear is less sensitive to low and high frequencies at low sound levels. This justifies increasing the bass-treble settings for musical sources in the home setting.

Vocal and musical sounds have distinctively different time series contents. Vocal sounds or contents typically comprise vowels, consonants, and silence. Silent parts are abundant between vowels and consonants. On the other hand, musical sounds are very continuous.

Certain conventional audio or audio-visual systems may have sound equalizers built in for adjusting the bass-treble controls of an audio system or an audio-visual system. For listening to the musical contents with conventional systems, the bass-treble settings may be increased to make the music contents sound more realistic. However, for vocal contents, a decrease in the bass-treble settings results in a better signal to noise ratio. An automatic equalizer device alters the source frequency spectrum by automatically adjusting the bass-treble settings depending on the program source.

The present invention also uses a microcomputer, such as a microprocessor, to automatically equalize a source frequency spectrum and to automatically level the sound in an audio or audio-visual system. In particular, FIG. 7 illustrates another embodiment of optional preprocessing circuitry 32a adapted for both audio leveling and equalizing functions. As illustrated in FIG. 7, the left L and right R signals, which may be obtained from the source of audio signals shown in FIGS. 1 and 2, are amplified and inputted to the optional preprocessing circuitry 32a. Amplifiers 108, 110 are use to amplify the L and R audio signals. The optional preprocessing circuitry 32a includes an adder 111 for receiving and combining the L and R audio signals from the amplifiers 108, 110, and detector-rectifier circuits 120, 126 for detecting and rectifying the left L and right R signals.

Time constants required for automatic equalizing are shorter (sampling rates higher) than that required for audio leveling. Accordingly, the detector-rectifier circuits 120, 126 have different time constants, and two inputs to the microprocessor 36, for controlling the volume and tone, as seen in FIG. 7.

In FIG. 7, incoming left L and right R signals are inputted to the amplifiers 108, 110, respectively. From the amplifiers 108, 110 the L and R signals are combined and are fed to the detector-rectifier circuits 120, 126, or other smoothing means. A first detector-rectifier circuit 120 may include a rectifier 112, a resistor 116 and a capacitor 118, with a time constant longer than that of the other detector-rectifier circuit 126. The second detector-rectifier circuit 126 may include a rectifier 114, a resistor 122 and a capacitor 124, with a shorter time constant than the detector-rectifier circuit 120. The signal S from the output 119 of the detector-rectifier circuit 120, which is a signal with a longer time constant, is fed to the microprocessor 36 as the input port for audio signals used to control the volume function of an audio or audio-visual system. The signal T from the output 125 of the detector-rectifier 126, which provides a signal with a shorter time constant, is fed to the microprocessor 36 as the input port for audio signals used to control the tone function of an audio or audio-visual system.

As a variation, if it is desired to use only one input of the microprocessor, the incoming signal T from the detector-rectifier circuit 126 with the shorter time constant can be used by the microprocessor to control both the volume and the tone of the audio or audio-visual system. In this case, the signal S from the detector-rectifier circuit 120 is not input to the microprocessor 36. A computer algorithm, which runs the microprocessor 36, performs an averaging function instead of the detector-rectifier circuit 120. The average level can be calculated by summing the level of the incoming signal T for a certain period and dividing by the number of observations, as follows:

$$\text{Average level} = \frac{\sum Si}{n}$$

where: Si is the level of an incoming signal T for a single observation; and n is the number of observations.

Figure 8B:
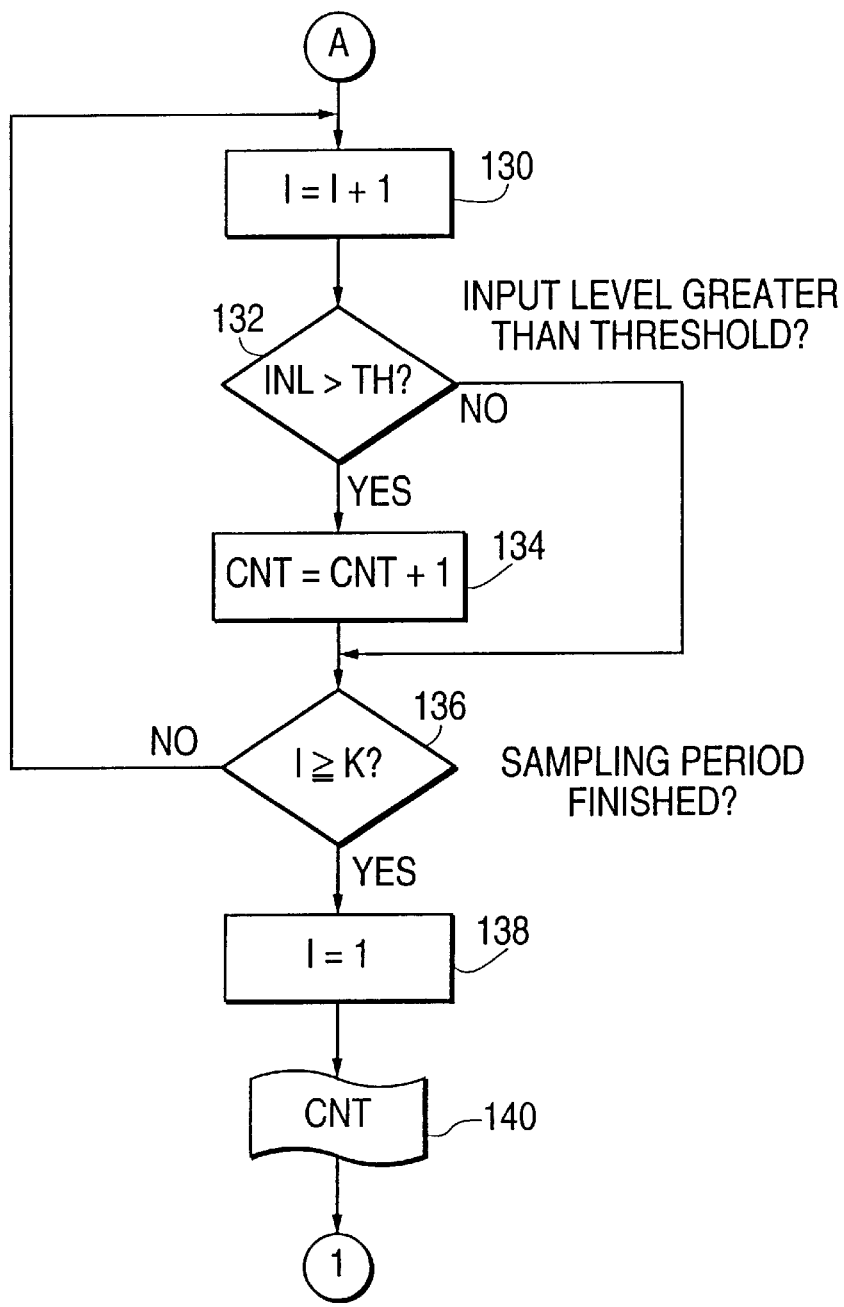
FIGS. 8b, 8c and 8d show a flow chart of the program executed by the microcomputer portion of the apparatus shown in FIG. 7.
Figure 8A:
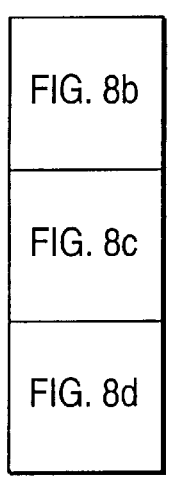
FIG. 8a is a block diagram showing how the flow charts shown in FIGS. 8b, 8c and 8d interface.
Figure 8C:
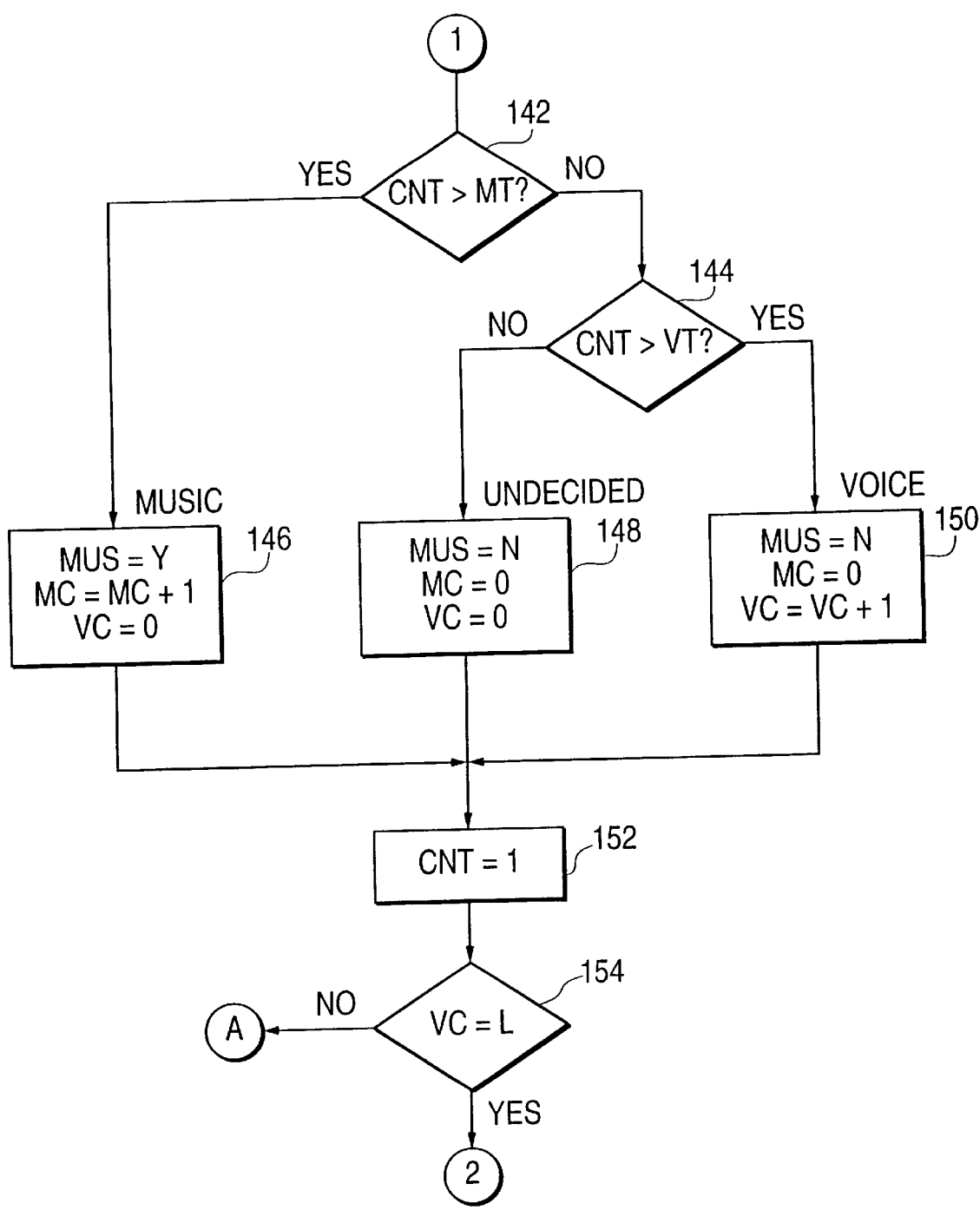
Figure 8D:
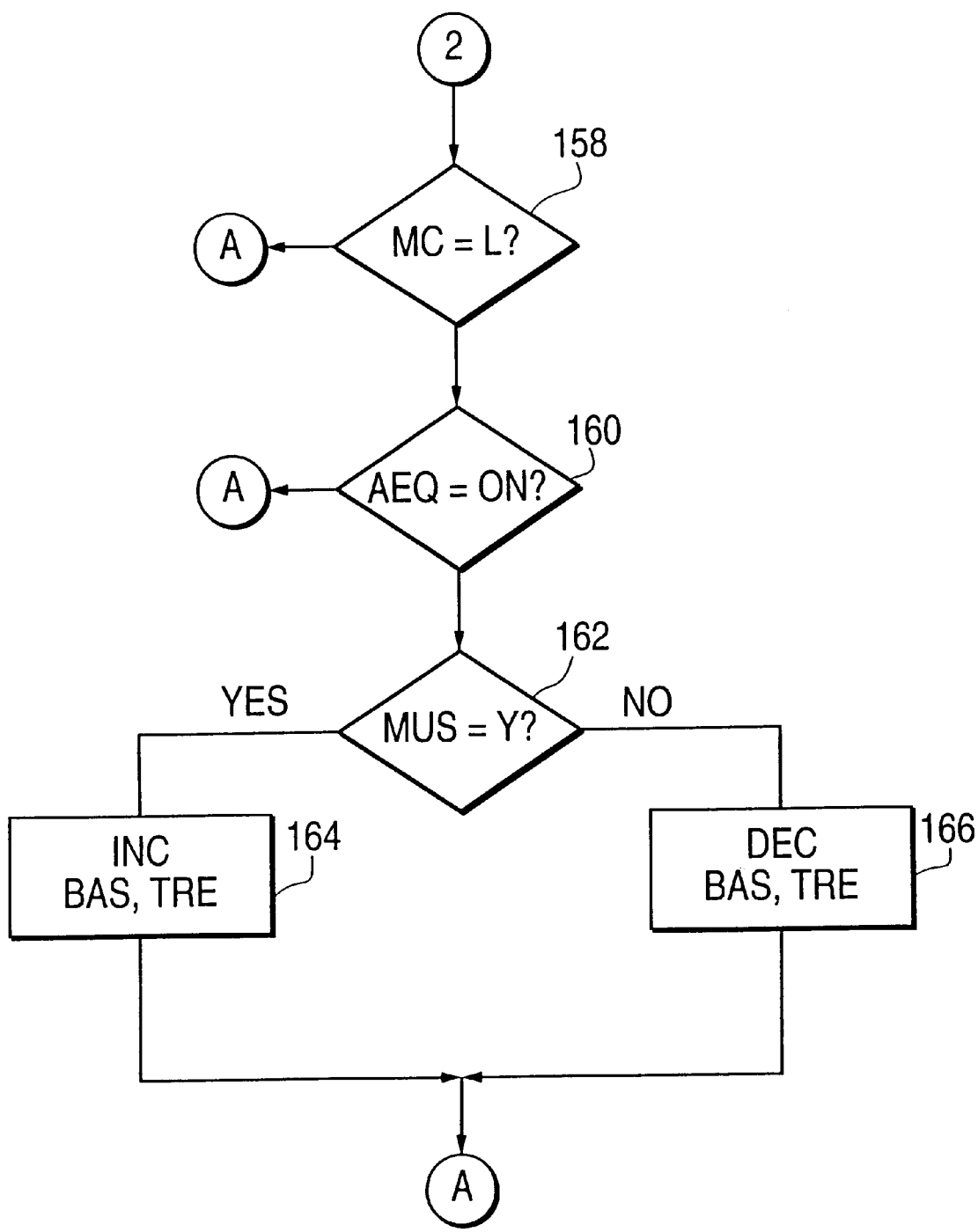

Turning now to FIGS. 8b–8d, there is illustrated a flow diagram for automatically equalizing audio signals. The microprocessor 36 monitors the input signal T at certain intervals, typically 4 ms, for a certain duration, typically 1 second. If the number of positive pulses is less than a threshold, the signal is determined to include vocal content. If number of positive inputs exceeds another threshold, the incoming signal is determined to include musical content. When the pulse count falls between these two thresholds, no determination is made as to whether the signal are either vocal or musical.

To help ensure a correct judgment, the process may be repeated more than once. For example, if after the microprocessor repeats the process, an incoming signal T is determined to be from a musical source, the microprocessor 36 sets an automatic equalizer program for a musical setting.

FIGS. 8b, 8c and 8d illustrate a flow diagram of a program, which is preferably executed by the microcomputer 36 to control the automatic equalizer. At block 130 in FIG. 8b, every time the microprocessor receives a sample of the T signal, it increments a counter I, by one. At the next step 132, the incoming signal is compared with a threshold. If the incoming signal exceeds the threshold, another counter CNT is incremented by one at block 134. Otherwise, the process or algorithm proceeds to block 136. Block 136 keeps track of the sampling activity. If the number of samplings has reached the number K, for example 256, the process proceeds to block 138, where the sampling counter I resets. Otherwise, another sample of the T signal is processed by returning to block 130. In block 140, the value of the counter CNT will be sent to the next block 142.

When one sample period is completed, the counter CNT is compared to a musical threshold MT at block 142 of FIG. 8c. As mentioned before, musical content is fairly continuous; thus, the musical threshold MT is set high. For example, if the process determines that the incoming signals represent musical content when the positive observation counter CNT exceeds 240 times out of total of 256 samplings, then the process proceeds to block 146. If not, the process proceeds to block 144 for a further conditional comparison. Block 144 compares the counter CNT to another threshold VT for vocal content, for example a threshold value of 40. If the counter CNT is above the vocal content threshold, the result is "undecided" and the process proceeds to block 148. Otherwise, the process proceeds to block 150. These threshold levels can be determined empirically by observing some musical and vocal sources.

Block 146, for "musical", sets the musical flag MUS to Y for yes, increments the musical counter MC, and resets the vocal counter VC. Block 148, for "undecided", sets the musical flag MUS to N for no, resets the musical counter MC and resets the voice counter VC. Block 150, for "vocal", sets the musical flag MUS to N for no, increments the voice counter VC, and resets the musical counter MC. From blocks 146, 148 and 148, the process proceeds to block 152. At the beginning of block 152, one sampling period and decision cycle has completed. The block resets the counter CNT.

To reduce the chances of obtaining a false decision, this decision process can be repeated more than once. Block 154 tests if the voice counter VC has reached a value L, and when the voice counter VC has reached such a value, the process proceeds to adjust the automatic equalizer setting at point 2 of FIG. 8d. Otherwise, the process returns to the beginning of the process. At block 158 of FIG. 8d, a similar comparison testing may be carried out for the music counter MC. Block 158 tests if the music counter MC has reached a value L, and when the music counter MC has reached such a value, the process proceeds to block 160. By setting L to 1, the process will not repeat the decision process.

Block 160 checks if the automatic equalizer AEQ has been activated. If not, the process goes back to the beginning of the process. Otherwise, the process increases or decreases the bass-treble settings depending on the status of the musical flag MUS, and then returns to the beginning of the process.

Figure 9:
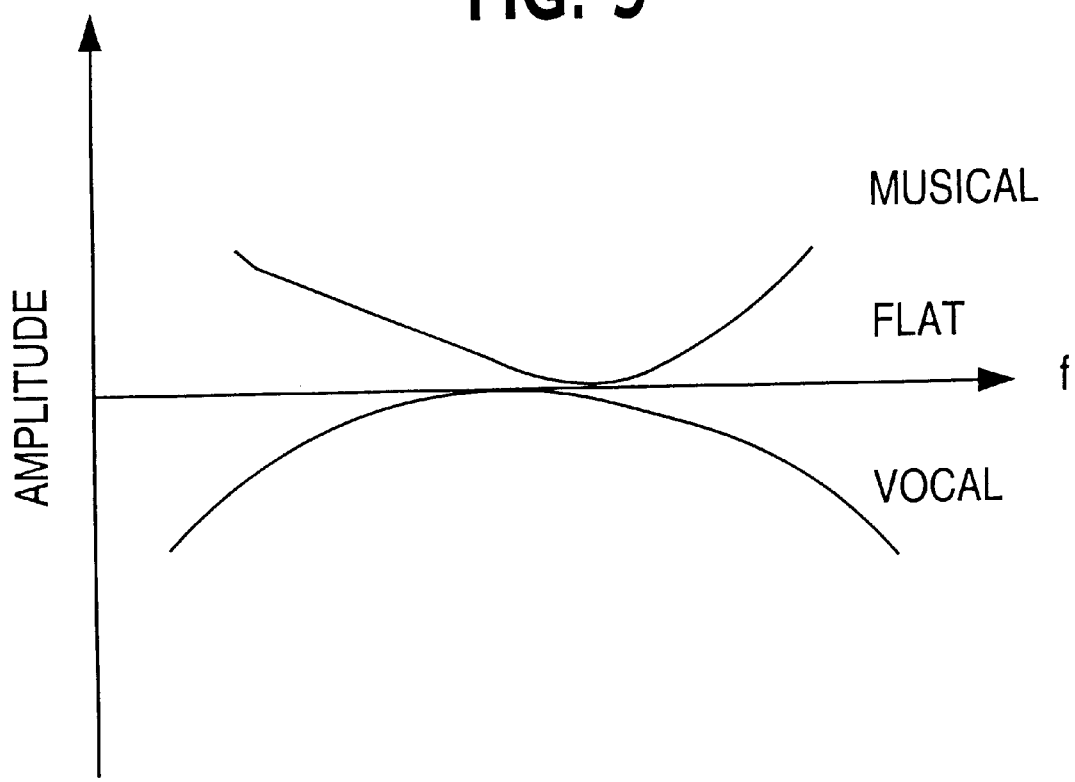
FIG. 9 is a graph of an audio signal amplitude versus frequency for musical and vocal content, as well as a flat in between level.

A further improvement of the present invention may be to include a flat equalizer level setting. At block 148 in FIG. 8b, instead of setting the equalizer for musical or vocal, the process can set the equalizer to a flat setting for "undecided" as seen FIG. 9.

An audio device with both audio leveling (AL) means and automatic equalizing (AE) means may present four options or audio settings for selection by the listener. Specifically, a listener has the choice of the following settings: (1) AL "on"

and AE "on", (2) AL "on" and AE "off", (3) AL "off" and AE "on", or (4) AL "off" and AE "off". The listener may manually set the system to any combination of these settings. The particular combination of settings selected will depend on the preference of the listener. For example, if the listener desires the audio output for background sound only, the listener can select the combination (1).

The status of the automatic equalizer means and audio leveling means may be displayed on a audio or visual-audio system in form of one or more indicators. For example, one type of indicator may comprise one or more indicator lights on an audio system . Another form of indicator may comprise an indicator displayed on the screen of a display device. The display device may be conventional analog (NTSC) television, digital television, computer display, or some other audio visual device.

Figure 10:
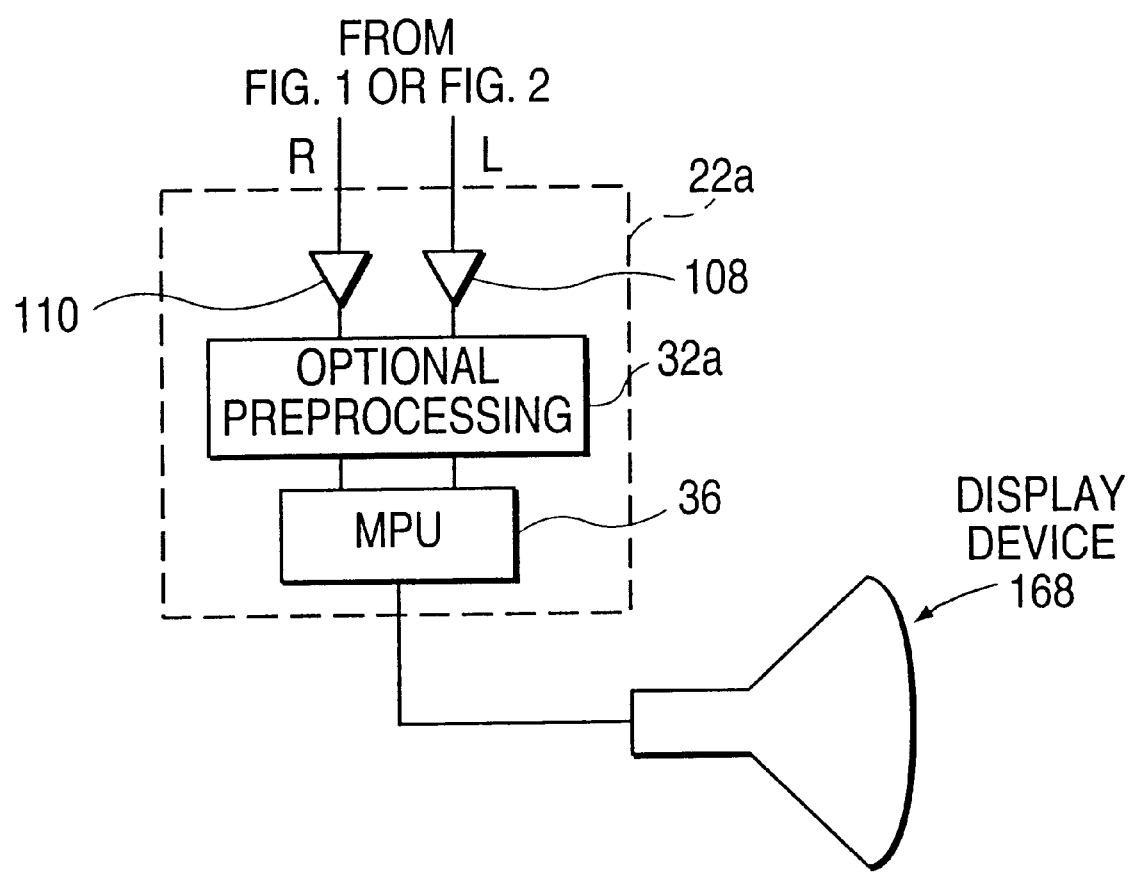
FIG. 10 is a block diagram showing several key elements of an audio-visual device or system.

As seen in FIG. 10, the audio leveling and equalizing device 22a, comprising a microprocessor 36, an optional preprocessing unit 32a, and amplifiers 108, 110, may be interfaced to the display device 168. The left L and right R audio signals shown in FIGS. 1 and 2 may serve as the input signals for the optional preprocessing element 32a. Such a system is capable of displaying the status of the leveled audio output and the status of automatic equalizing function, as shown in FIG. 11.

An onscreen display may help the user or viewer decide if they want to use the automatic equalizer and/or the audio leveling features. FIG. 11 shows an example of a possible on-screen display 174, in which text and/or graphics may be overlaid onto a television video display. The automatic equalizer means and the audio leveling means may be set "on" or "off", via another on screen menu (not shown). The microprocessor 36 controls the setup and display of the information on the screen 174 of the display device 168. The viewer or listener may affect such a selection with a remote control device, a hardware switch, a keyboard, or other similar switching means. The switching means is interfaced to the microprocessor for the overall control of the audio-visual system.

Figure 11:
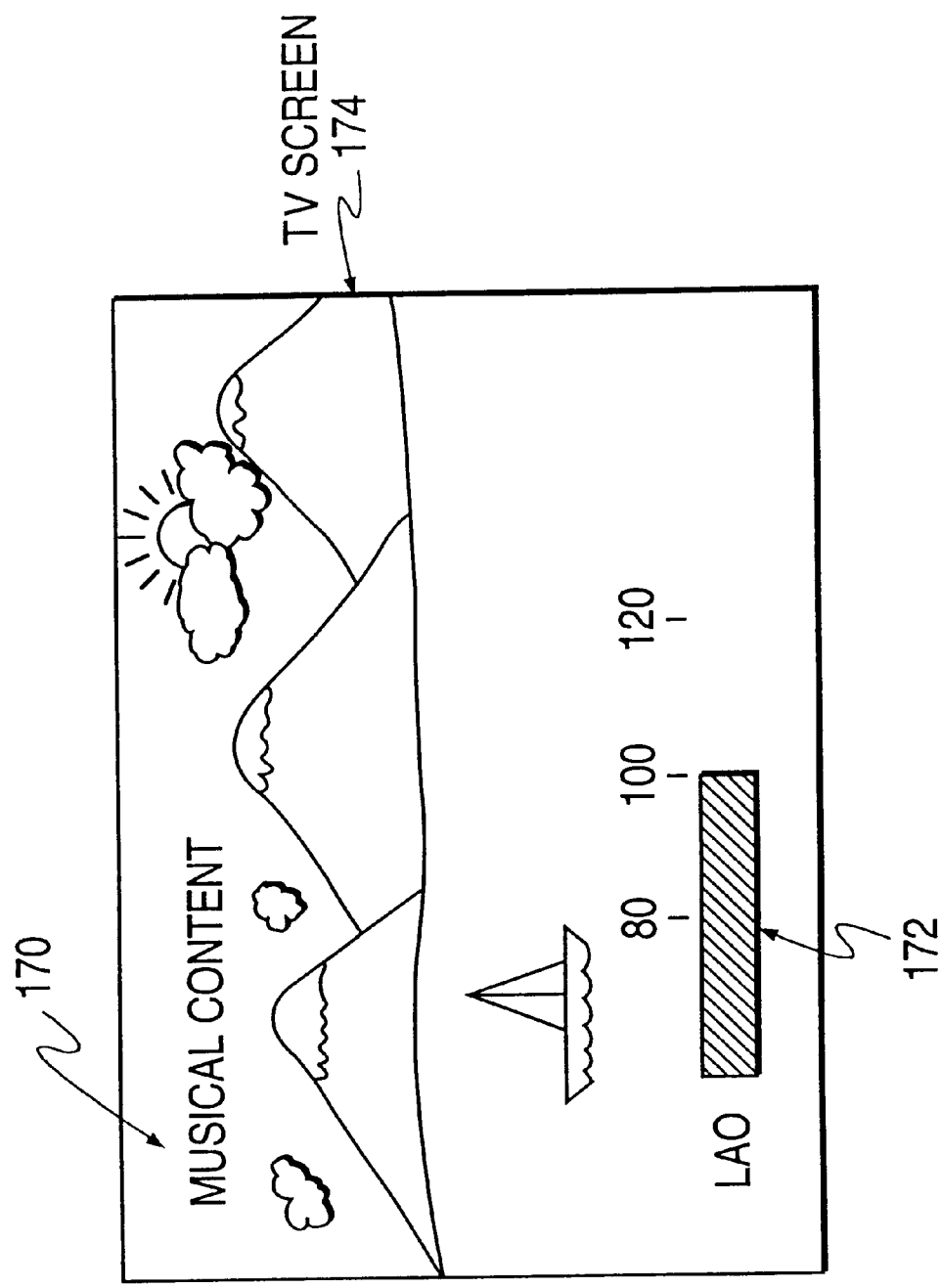
FIG. 11 is a sample of an on-screen display showing audio content and leveled audio output indicators overlaid on a typical television picture.

The display screen 174 in FIG. 11 shows the text MUSICAL CONTENT, which may be placed in the upper left corner of the screen, indicating that musical content is being detected. The on-screen display may show the automatic equalizer means changing between MUSIC CONTENT and VOICE CONTENT, dynamically. Also shown in the FIG. 11, is a bar graph 172 that may be placed at bottom of the display screen 174, which indicates the audio amplifier gain of the leveled audio output (LAO). This indicator provides the listener with dynamic feedback information on the LAO in relation to a nominal gain, which may be typically set a level 100. Thus, in this example the LAO may be a range between levels 80 and 120.

Still another improvement of the present invention includes providing a gradual change of the automatic equalizer settings when changing between voice and music content. When the source frequency spectrum suddenly is changed by the automatic equalizer, it may be quite noticeable and undesired. Instead of changing between musical and vocal states very quickly, the equalizer can be adapted to change a little at a time; until it reaches the desired setting by the program shown in FIG. 12.

Figure 12:
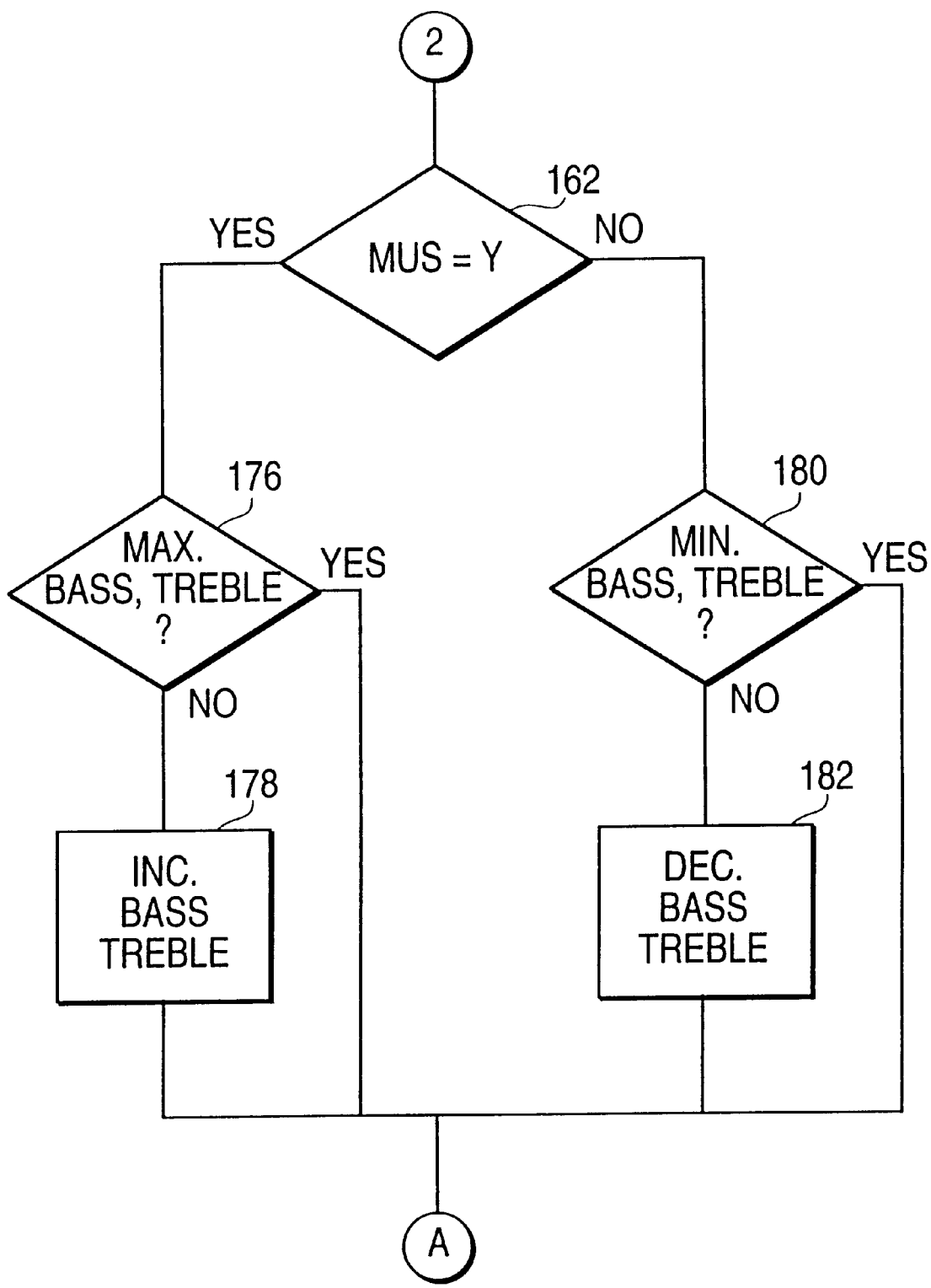
FIG. 12 is an alternate block diagram of the portion of the program shown in FIG. 8d for gradual transitions between musical content and vocal content.

FIG. 12 shows a portion of an alternate program that can be used in combination with the program shown in FIGS. 8b and 8c, instead of FIG. 8d to eliminate the above described undesired effect and bring about a gradual change to affect a gradual transition between musical and vocal content settings. Block 162 decides if the setting should be musical or vocal. Blocks 176 and 180 check if the bass-treble settings have reached a desired setting. If the settings have reached the desired settings, the process returns to the beginning. Otherwise, the bass-treble settings are altered to less than their maximum level. For example, if the process determines the incoming signal is music, instead of increasing the bass-treble settings by 6 dB, it may increase it just by 2 dB. Then, the process goes back to the beginning. If the next two determinations are still musical contents, these settings may be increased by 2 dB at time, until it reaches 6 dB. The values of 2 dB and 6 db are only examples of the values that can be used.

As another variation, the present invention may be used for processing audio signals from multiple channels. Audio signals may be inputted to the optional preprocessing unit 32 from more than two channels, or for that matter from less than two channels. For example, in the case of four channels, the adder 44 (FIG. 3) would receive and combine four detected audio signals. When the optional preprocessing unit circuitry 32 is not used, an adder 82 (FIG. 5) or 94 (FIG. 6), would add the processed signals and provide a time-divided power signal S to the microcomputer 36 to carry out the audio leveling function. Also, in the case of the present invention directed at the carrying out of the combined functions of audio signal leveling and source frequency spectrum equalizing, audio signals may be inputted to the optional preprocessing unit 32a from more than two channels, or for that matter from less than two channels. In a similar manner, the adder 111 (FIG.7) would receive and combine amplified audio signals from the number of channels in a audio or audio-visual system for processing by the detector-rectifier circuits 120, 126 and the microprocessor 36 for performing the combined audio signal leveling and source frequency spectrum equalizing functions.

Of course, it should be understood that a wide range of changes and modifications can be made to the preferred embodiment described above and that the foregoing description be regarded as illustrative rather than limiting. It is therefore intended that it is the following claims, including all equivalents, which are intended to define the scope of this invention.

What is claimed is:

1. A method of digitally processing audio signals of an audio or audio-visual system to automatically adjust the sound output characteristics of the system, comprising the steps of:

(a) comparing a time divided audio signal to a predefined threshold value for determining if said audio signal is above said predefined threshold value,
   wherein said predefined threshold value represents a low level audio signal;

(b) subtracting a predetermined value from said time divided audio signal if said audio signal exceeds said predefined threshold value,
   wherein said predetermined value is approximately equal to the maximum magnitude of said audio signal divided by a value ranging approximately from 2 to 4, and
   wherein said substraction step results in a control signal that is within a range set by the said predetermined value;

(c) multiplying a user selectable volume level setting by said control signal so as to obtain a scaled control signal; and (d) adding said scaled control signal to the selectable volume setting level.

2. The method of digitally processing audio signals according to claim 1, further comprising the steps of:

(e) squaring said time divided audio signal;

(f) summing n consecutive values of said time divided audio signal generated by said squaring step so as to generate a summing result; and (g) calculating the square root of said summing result and utilizing the result in steps (a)–(d).

3. The method of digitally processing audio signals according to claim 2, wherein said time divided audio signal comprises signals from multiple channels.

4. The method of digitally processing audio signals according to claim 2, further comprising the steps of:

performing steps (e)–(g) on the signals associated with each of said multiple channels so as to generate a plurality of results; and adding said plurality of results to one another.

5. The method of digitally processing audio signals according to claim 2, further comprising the steps of:

(h) calculating an absolute value of said time divided audio signal; and (i) summing the last n values of said time divided audio signal generated by said absolute value calculation step and utilizing the result in steps (a)–(d).

6. The method of digitally processing audio signals according to claim 5, wherein said time divided audio signal comprises signals from multiple audio channels.

7. The method of digitally processing audio signals according to claim 6, further comprising the steps of:

performing steps (h)–(i) on the signals associated with each of said multiple audio channels so as to generate a plurality of results; and adding said plurality of results to one another.

8. The method of digitally processing audio signals according to claim 1, further comprising the steps of:

checking for a mute on-off condition after said control signal is multiplied to said selectable volume setting level, and returning to step (a) under a mute on condition.

9. A digital audio leveling apparatus for an audio or audio-visual system to automatically adjust the volume characteristics of the system, comprising:

a digital audio decoder operative for decoding audio signals into multi channel audio signals;

a digital volume controller coupled to an output of said digital audio decoder for generating volume controlled audio signals;

a microprocessor coupled to an output of said digital audio decoder and to an input of said digital volume controller for controlling the volume of the audio signals generated by said digital volume controller; and a digital audio amplification unit coupled to an output of said digital volume controller, wherein said microprocessor classifies said audio signals into a voice category, a musical category and an undecided category and compensates for power variations in said audio signals on the basis of said classification to maintain a substantially constant volume from said digital audio amplification unit.

10. A digital audio leveling apparatus for an audio or audio-visual system to automatically adjust the volume characteristics of the system, comprising:

a digital audio decoder operative for decoding audio signals into multi channel audio signals;

a digital volume controller coupled to said digital audio decoder for accepting said multi channel audio signals;

a microprocessor coupled to an output of said digital volume controller and to an input of said digital volume controller for controlling the volume of the audio signals generated by said digital volume controller; and a digital audio amplification unit coupled to an output of said digital volume controller, wherein said microprocessor classifies said audio signals into a voice category, a musical category and an undecided category and compensates for power variations in said audio signals on the basis of said classification to maintain a substantially constant volume from said digital audio amplification unit.

11. A method of digitally processing audio signals of an audio or audio-visual system to automatically adjust the sound output characteristics of the system, comprising the steps of:

summing audio signals from multiple audio channels;

sampling the summed audio signals at a first sampling rate for use in leveling the volume of the summed audio signals;

sampling the summed audio signals at a second sampling rate for equalizing the source frequency spectrum of the summed audio signals, wherein the second sampling rate is higher than the first sampling rate;

processing the summed audio signals sampled at a first rate for leveling the volume of the summed audio signals via digital calculations; and processing the summed audio signals sampled at a second rate for equalizing the source frequency spectrum of the summed audio signals via digital calculations, wherein a substantially constant volume and an equalized frequency spectrum is maintained in the sound of the audio or audio-visual system.

12. The method of digitally processing audio signals according to claim 11, further comprising the step of:

amplifying audio signals from multiple audio channels prior to said step of summing audio signals from multiple audio channels.

13. The method of digitally processing audio signals according to claim 11, further comprising the steps of:

selecting a condition that controls the processing steps by processing only the summed audio signals sampled at said first rate, only the summed audio signals sampled at said second rate, both the summed audio signals sampled at said first rate and the summed audio signals sampled at said second rate, or neither the summed audio signals sampled at said first rate nor the summed audio signals sampled at said second rate; and processing the summed audio signals sampled at a first rate, and/or at a second rate, or not at all, depending on the condition selected.

14. The method of digitally processing audio signals according to claim 13, further comprising the step of:

displaying the selected condition on the audio or audio-visual system.

15. The method of digitally processing audio signals according to claim 14, further comprising the step of:

displaying information reflecting the status of the volume of the summed audio signals sampled at said first rate during the processing of such signals and/or the status of the frequency spectrum of the summed audio signals sampled at said second rate during the processing of such signals.

16. The method of digitally processing audio signals according to claim 11, wherein the equalizing of the source frequency spectrum by said step of processing the summed audio signals sampled at a second rate is carried out in a gradual manner.

17. A method of digitally processing audio signals of an audio or audio-visual system to automatically adjust the sound output characteristics of the system, comprising the steps of:

summing audio signals from multiple audio channels;

sampling the summed audio signals at a sampling rate for use in leveling the volume and for equalizing the source frequency spectrum of the summed audio signals;

summing a number of sampled audio signals over a period of time and dividing the summed sample of audio signals by the number of samples over a period; and processing the audio signals sampled over a period of time and divided by the number of samples over a period by leveling the output and equalizing the source frequency spectrum of the summed audio signals via digital calculations, wherein a substantially constant volume and an equalized frequency spectrum is maintained in the sound of the audio or audio-visual system.

18. The method of digitally processing audio signals according to claim 17, further comprising the step of:

amplifying audio signals from multiple audio channels prior to said step of summing audio signals from multiple audio channels.

19. A method of digitally processing audio signals of an audio or audio-visual system to automatically adjust the sound output characteristics of the system, comprising the steps of:

automatically leveling the volume of audio signals;

classifying said audio signals into a voice category, a musical category and an undecided category; and altering a source frequency spectrum of the audio signals by automatically adjusting equalizer settings on the basis of said classification, wherein a substantially constant volume and an equalized frequency spectrum is maintained in the sound of the audio or audio-visual system.

20. An apparatus for digitally processing audio signals of an audio or audio-visual system for automatically adjusting the sound output characteristics of the system, comprising:

an adder for summing audio signals from multiple audio channels;

means for sampling the summed audio signals at a first sampling rate for use in leveling the volume of the summed audio signals;

means for sampling the summed audio signals at a second sampling rate that is higher than said first sampling rate for equalizing the source frequency spectrum of the summed audio signals; and a microprocessor receiving samplings of the summed audio for processing the summed audio signals sampled at a first rate for leveling the volume of the summed audio signals via digital calculations and for processing the summed audio signals sampled at a second rate for equalizing the source frequency spectrum of the summed audio signals via digital calculations, wherein a substantially constant volume and an equalized frequency spectrum is maintained in the sound of the audio or audio-visual system.

21. The apparatus for digitally processing audio signals according to claim 20, further comprising:

an amplifier for each channel connected to said adder for amplifying the audio signal in the channel prior to being inputted to said adder.

22. The apparatus for digitally processing audio signals according to claim 20, further comprising:

a digital volume and tone control receiving the volume leveled and frequency spectrum equalized signals from said microprocessor.

23. The apparatus for digitally processing audio signals according to claim 20, further comprising:

means for selecting a condition for controlling said microprocessor to process only the summed audio signals sampled at said first rate, only the summed audio signals sampled at said second rate, both the summed audio signals sampled at said first rate and the summed audio signals sampled at said second rate, or neither the summed audio signals sampled at said first rate nor the summed audio signals sampled at said second rate, wherein said microprocessor processes audio signals by leveling the volume of the audio signals, or by equalizing the source frequency spectrum of the audio signals, or by both leveling the volume of the audio signals and by equalizing the source frequency spectrum of the audio signals, by not performing either function, depending on the condition selected.

24. The apparatus for digitally processing audio signals according to claim 23, wherein said selecting means comprises a switching means.

25. The apparatus for digitally processing audio signals according to claim 24, wherein said selecting means comprises a menu on a display screen of an audio-visual system and a remote control device for making a selection from said menu.

26. The apparatus for digitally processing audio signals according to claim 23, further comprising:

means for displaying a selected condition on the audio or audio-visual system.

27. The apparatus for digitally processing audio signals according to claim 23, further comprising:

means for displaying information reflecting the status of the volume of the summed audio signals sampled at said first rate during the processing of such signals and/or the status of the frequency spectrum of the summed audio signals sampled at said second rate during the processing of such signals.

28. The apparatus for digitally processing audio signals according to claim 27, said displaying means displays the status of the volume of the summed audio signals sampled at said first rate during the processing of such signals and/or the status of the frequency spectrum of the summed audio signals sampled at said second rate during the processing of such signals.

29. An apparatus for digitally processing audio signals of an audio or audio-visual system for automatically adjusting the sound output characteristics of the system, comprising:

an adder for summing audio signals from multiple audio channels;

means for sampling the summed audio signals at a sampling rate for use in leveling the volume and for equalizing the source frequency spectrum of the summed audio signals; and a microprocessor receiving the samplings of the summed audio signals and leveling the volume of the output and equalizing the source frequency spectrum of the summed audio signals via digital calculations, said microprocessor classifying said summed audio signals in a voice category, a musical category and an undecided category, wherein a substantially constant volume and an equalized frequency spectrum is maintained in the sound of the audio or audio-visual system.

30. The apparatus for digitally processing audio signals according to claim 29, further comprising:

an amplifier for each channel connected to said adder for amplifying the audio signal in the channel prior to being inputted to said adder.

31. An apparatus for digitally processing audio signals of an audio or audio-visual system for automatically adjusting the sound output characteristics of the system, comprising:

means for classifying said audio signals into a voice category, a musical category and an undecided category;

an automatic equalizer for altering a source frequency spectrum of audio signals by automatically adjusting equalizer settings depending on the content of the source frequency spectrum; and an audio leveler for automatically leveling the volume of audio signals, wherein said audio leveler is electrically interfaced with said automatic equalizer, and wherein a substantially constant volume and an equalized frequency spectrum is maintained in the sound of the audio or audio-visual system.

\* \* \* \* \*